United States Patent [19]

Goell

[11] 3,751,248

[45] Aug. 7, 1973

[54] METHOD OF SELECTIVE MULTILAYERED ETCHING

[75] Inventor: James Emanuel Goell, Middletown, N.J.

[73] Assignee: Bell Telephone Laboratories, Incorporated, Murray Hill, N.J.

[22] Filed: Dec. 27, 1971

[21] Appl. No.: 212,798

Related U.S. Application Data

[63] Continuation-in-part of Ser. No. 826,436, May, 1969, abandoned.

[52] U.S. Cl. .......... 96/36.2, 96/36

[51] Int. Cl. .......... G03c 5/00

[58] Field of Search .......... 96/36.2, 32, 36, 96/30

[56] References Cited

UNITED STATES PATENTS

| | | | |
|---|---|---|---|
| 3,376,139 | 4/1968 | Giangualano et al. | 96/36.2 |
| 3,510,371 | 5/1970 | Frankson | 96/36.2 |
| 3,144,333 | 8/1964 | Waldheer | 96/32 |

*Primary Examiner*—Norman G. Torchin
*Assistant Examiner*—Edward C. Kimlin
*Attorney*—W. L. Keefouver

[57] ABSTRACT

A method for selectively etching a workpiece to different depths with a single multicolored photomask. In particular, the multicolored mark is used to selectively expose separate layers of photoresist. The separatelayers of photoresist are developed, and then selectively removed after performing a desired masking function. This method is particularly useful in fabricating resistor-conductor patterns for integrated circuits.

8 Claims, 8 Drawing Figures

INVENTOR
J. E. GOELL
BY
ATTORNEY

METHOD OF SELECTIVE MULTILAYERED ETCHING

CROSS REFERENCE TO RELATED APPLICATION

This application is a continuation-in-part of applicant's copending application, Ser. No. 826,436, filed May 21, 1969, now abandoned.

BACKGROUND OF THE INVENTION

This invention relates to a method for selectively etching a workpiece to different depths using different colored light beams and a number of layers of photoresist. The method is particularly useful in the fabrication of integrated circuits.

Many processes for the fabrication of integrated circuits utilize the well-known photoresist technique which, in essence, involves coating a surface to be etched with a photoresist emulsion, exposing selected portions of the emulsion to light through a photomask, and developing the exposed portion to produce an etch resistant mask. After the surface has been etched, the mask is removed.

One difficulty associated with this technique, however, is that most integrated circuits — even simple resistor-conductor circuits — are multilayered structures requiring multiple application of the technique to produce the required geometry. Consequently there is a duplication of steps and the somewhat tedious task of properly aligning successive photomasks with respect to the preceding etching.

SUMMARY OF THE INVENTION

In accordance with the present invention, a structure is selectively etched to different depths by the use of different colored light beams to selectively expose separate layers of photoresist which can be developed and then separately removed after performing a desired masking function. Advantageously the different colored beams can be produced by shining white light through a multicolored mask.

BRIEF DESCRIPTION OF THE DRAWINGS

The nature of the present invention and its various features will appear more fully upon consideration of the illustrative embodiment now to be described in detail in connection with the accompanying drawings in which.

DETAILED DESCRIPTION

Figure 1:
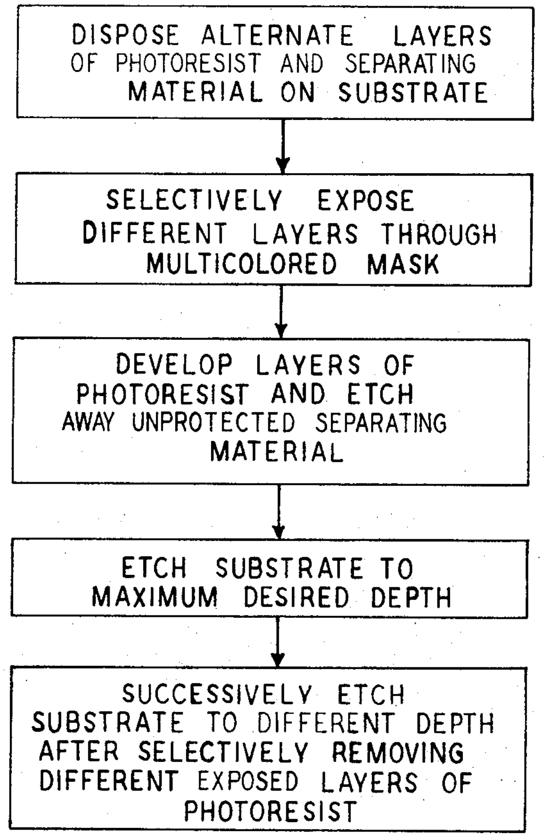
FIG. 1 is a flow diagram showing the steps of one embodiment of a fabrication process in accordance with the invention.

FIG. 1 is a flow diagram showing the steps of one embodiment of a fabrication process in accordance with the invention. As can be seen from the diagram, the first step involves disposing on the workpiece to be etched, typically a dielectric substrate having a number of thin films of material disposed thereon, layers of photoresist that can be selectively exposed by different colored light. For example, the top layer can be blue-sensitive, the second layer green-sensitive and the third layer red-sensitive. Thin layers of filter material which prevent more than one layer of photoresist from being exposed by the same color of light are disposed between successive layers. Alternatively, the order of color sensitivity of the photoresist can be reversed, and the separating layers can be made of a transparent material, such as $SiO_2$ and other materials, which can be removed by etchants which do not attack the photoresists. In the usual case there will be as many layers of photoresist as there are depths or layers to be selectively etched.

The second step involves selectively exposing areas of the workpiece to beams of different colored light to selectively expose desired portions of each of the layers of photoresist. This is readily accomplished by shining white light through a multicolored filtering mask disposed immediately above the workpiece. Each of the layers of photoresist, beginning with the top layer, is then developed to remove the unexposed portions of the photoresist. The portions of the separating film not masked by an overlying layer of exposed photoresist are also etched away. This process is repeated until the bottom layer of photoresist is developed.

The next step involves etching away the unmasked portions of the substrate to the maximum desired depth. In the case of a multilayered substrate, all of the layers to be etched are etched away in those areas which are not covered by one of the exposed portions of photoresist.

In the next series of steps, the substrate is etched to different depths after each of the layers of photoresist and separating material are removed. The removal of the photoresist layers can be accomplished, for example, by completely dissolving the underlying separating layer. This step is repeated until all of the layers of photoresist except the bottom one are etched away. For a multilayered substrate each time a layer of exposed photoresist is removed, one less layer on the substrate is etched, until the bottom layer of exposed photoresist is reached and the top layer of the substrate is etched. The last layer of photoresist is then etched away and only the desired configuration remains.

This process will become more concrete in connection with the following specific examples.

EXAMPLE 1

FIGS. 2A, 2B, 2C and 2D are cross sections of a simple resistor-conductor circuit at various stages of fabrication in accordance with a first embodiment of the invention.

Figure 2A:
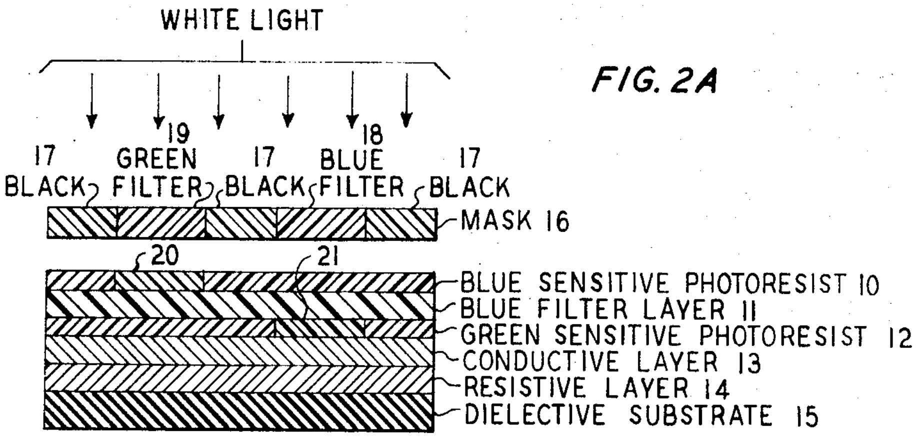
FIGS. 2A, 2B, 2C and 2D are cross sections of a simple resistor-conductor circuit at various stages of fabrication in accordance with a first embodiment of the invention.

In FIG. 2A there is shown a workpiece comprising a dielectric substrate 15 such as glass, including thin films 14 and 13 of resistive and conductive materials, such as tantalum and gold, respectively. Typically these conductive and resistive layers are on the order of a few microns thick and are to be etched in patterns having dimensions of the order of several mils. Successively disposed upon conductive layer 13 are a layer 12 of green-sensitive photoresist such as poly(vinyl cinnamylidene acetate) sensitized with 4(paramyloxyphenol)-2,6-bis (4-ethylphenyl)-thiapyrlium perchlorate; a filter layer 11 of blue and ultraviolet absorbing material such as a few thousand angstroms of tetracene having a sufficient optical density to protect the underlying photoresist from exposure by blue light; and a layer 10 of blue-sensitive photoresist such as synthetic cyclized poly(isoprene) sensitized with 2,6-bis (p-azidobenzylidene)-4 - methyl-cyclohexanone.

Disposed immediately above the workpiece is a multicolored mask 16 comprising black portions 17, blue subtractive filters 18 and green subtractive filter 19. The green filter portion can include material such as phthalocyanine which absorbs lgiht in the green portion of the spectrum while permitting the passage of blue or ultraviolet light. The various portions of the mask are determined according to the circuit pattern to be ultimately produced. As will be seen below, black portions correspond to areas where the dielectric 15 is to be exposed; the green filter portions correspond to the resistive areas and the blue filter portions correspond to the conductive areas.

After the photoresist and filter layers have been disposed on the conductive surface, mask 16 is placed immediately above the workpiece and white light is shone through it onto the workpiece. Photoresist layer 10 is selectively exposed only at that portion 20 which is below green filter 19; and, similarly, photoresist layer 12 is exposed only at the portion 21 below blue filter 18. Neither layer is exposed below the black portion of the mask.

Figure 2B:
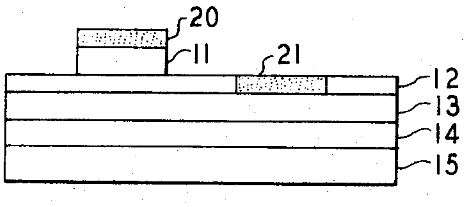

After the workpiece has been exposed, photoresist layer 10 is developed and filter layer 11 is etched away (tetracene, for example, can be dissolved in water) except where it is masked by exposed portion 20. The resulting structure is shown in FIG. 2B.

Figure 2C:
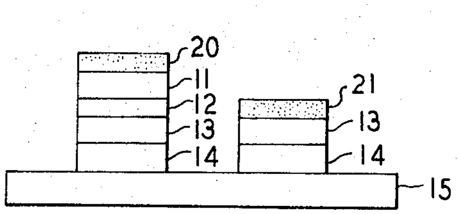
Figure 2D:
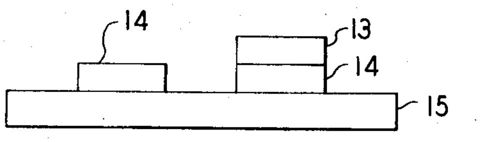

The exposed portion 21 of photoresist layer 12 is then developed and the workpiece is subjected to successive etches to remove the unmasked portions of the conductive and resistive layers, producing the structure of FIG. 2C.

The developed portion 20 of photoresist layer 10 is then selectively removed by, for example, etching away the underlying filter layer 11, and the remaining unexposed resist 12, leaving only the underlying conductive surface. The conductive surface is then etched; and, as the final step, the developed portion 21 of layer 12 is etched away, leaving the resistor-conductor pattern shown in FIG. 2D.

EXAMPLE 2

Figure 3A:
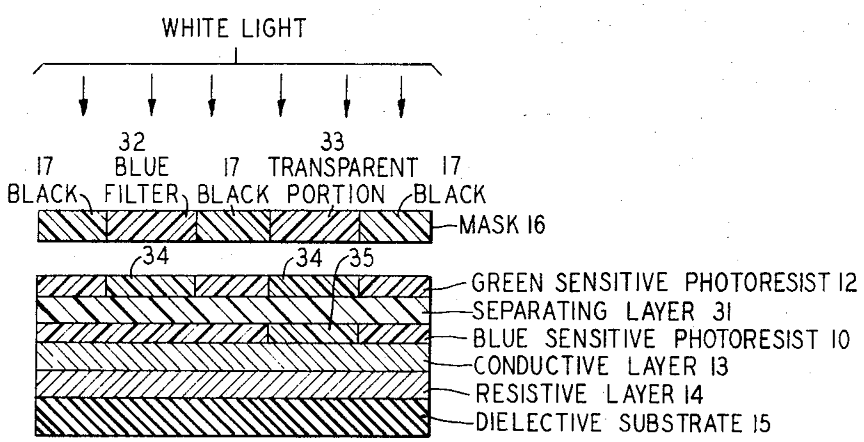
FIGS. 3A, 3B and 3C are cross sections of the same circuit fabricated in accordance with a second embodiment of the invention.
Figure 3B:
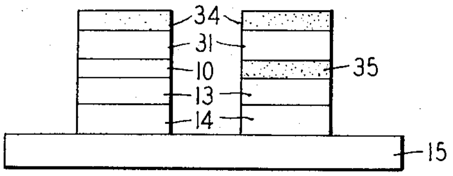
Figure 3C:
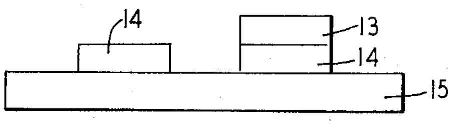

FIGS. 3A, 3B, and 3C are cross sections of the same circuit at various stages of fabrication according to a second embodiment of the invention.

The process is similar to that described in connection with FIG. 2 except that the two photoresist layers have been interchanged and the filter layer 11 replaced by a nonfiltering separating layer 31 such as a thin layer of sputtered $SiO_2$. In addition, the portion of the mask to correspond to resistive areas is now a blue subtractive filter 32 rather than a green subtractive filter 19 and the portion to correspond to conductive areas is transparent portion 33.

When white light is shone through mask 16, portions 34 of the green-sensitive photoresist beneath both the blue filter 32 and the transparent portion 33 are exposed. The blue-sensitive photoresist, however, is exposed only in the portion 35 beneath the transparent portion of the mask. The photoresist 12 is then developed, the separating layer 31 etched and the photoresist 10 developed.

The workpiece is then etched to the maximum desired depth, in this case to the substrate 15. The resulting structure is shown in FIG. 3B. Exposed photoresist 34 and separating layer 31 are then removed, as is the undeveloped portion of the blue-sensitive photoresist 10. This leaves only the exposed portion 35 of the blue-sensitive photoresist masking the workpiece. The workpiece is then subjected to a conductive layer etch, and the masking portion 35 removed, leaving the structure of FIG. 3C.

What is claimed is:

1. A method for selectively etching to different depths a workpiece with a plurality of layers of material formed on a substrate comprising the steps of:

disposing on said workpiece alternate layers of photoresist which are sensitive to light of different colors and separating material which may be removed without affecting underlying layers of photoresist;

exposing the resulting structure to different colored light beams through a mask such that separate exposed portions are produced in each layer of photoresist by a different color light beam;

removing those portions of said photoresist layers and said separating material layers which are not exposed or protected by an exposed portion of photoresist;

etching said workpiece to the substrate in the areas which are not protected by the exposed portions of said photoresist layers so as to form a plurality of patterns on said substrate each comprising a plurality of layers of workpiece material protected by an exposed portion of photoresist; and removing the exposed portions of photoresist and a desired number of underlying layers successively from each pattern so as to form the workpiece to different depths.

2. The method according to claim 1 wherein the structure is exposed to different colored light beams by shining white light through a multicolored filtering mask onto the workpiece.

3. The method according to claim 1 wherein said separating material is a subtractive filter material which can be removed to remove the overlying photoresist.

4. The method according to claim 1 wherein said alternate layers of photoresist and separating material comprise a layer of green-sensitive photoresist disposed on said workpiece, a layer of blue subtractive filter material and a layer of blue-sensitive photoresist disposed on the filter layer.

5. The method according to claim 4 wherein said workpiece comprises a dielectric substrate having a thin film of resistive material and a thin film of conductive material disposed thereupon.

6. The method according to claim 1 wherein said separating material is a transparent material which allows the overlying layer of photoresist to be removed without removing the underlying layer.

7. The method according to claim 1 wherein said alternate layers of photoresist and separating material comprise a layer of blue-sensitive photoresist disposed on said workpiece, a separating layer of transparent material and a layer of green-sensitive photoresist disposed on the separating layer.

8. The method of claim 7 wherein said workpiece comprises a dielectric substrate having a thin film of resistive material and a thin film of conductive material disposed thereupon.

* * * * *